United States Patent [19]

Furukawa et al.

[11] Patent Number: 4,672,362
[45] Date of Patent: Jun. 9, 1987

[54] BINARY DATA ENCODING AND DECODING PROCESS

[75] Inventors: Teruo Furukawa; Minoru Ozaki, both of Amagasaki, Japan

[73] Assignee: Mitsubishi Denki Kabushiki Kaisha, Tokyo, Japan

[21] Appl. No.: 851,081

[22] Filed: Apr. 14, 1986

[30] Foreign Application Priority Data

Apr. 15, 1985 [JP] Japan ................................ 60-78514

[51] Int. Cl.[4] ............................................. H03M 7/00
[52] U.S. Cl. ................................ 340/347 DD; 360/40
[58] Field of Search .................... 340/347 DD; 360/40

[56] References Cited

U.S. PATENT DOCUMENTS 3,374,475  3/1968  Gabor ..................................... 360/40
3,689,899  9/1972  Franaszek .
4,337,458  6/1982  Cohn .......................... 340/347 DD

OTHER PUBLICATIONS

P. A. Franaszek, 1970, Jul. IBM Journal. Res. Develop. "Sequence-State Methods for Run-Length-Limited Coding".
D. T. Tang and L. R. Bahl 1970, Information and Control 17, 436-461 "Block Codes for a Class of Constrained Noiseless Channels".
IEEE Transactions on Magnetics, vol. MAC-12, No. 6, Nov. 1976, pp. 740-742, "An Optimization of Modulation Codes in Digital Recording".

Primary Examiner—Charles D. Miller
Attorney, Agent, or Firm—Lowe Price LeBlanc Becker & Shur

[57] ABSTRACT

A binary data encoding process comprises the steps of separating a given binary data sequence at every two bits by a serial/parallel shift register (18), and converting the separated 2-bit data into a 3-bit code by using a logic circuit (19) and a parallel/serial shift register (20). A conversion pattern in the logic circuit (19) is exclusively determined based on the 2-bit data to be converted, 1-bit data immediately before and 2-bit data immediately after said 2-bit data, and a 3-bit code converted immediately before the conversion of said 2-bit data, wherein a succession of at least one but no more than seven "0" exists between an arbitrary "1" and the succeeding "1" in the converted 3-bit code sequence.

4 Claims, 15 Drawing Figures

FIG.1 PRIOR ART (a). ORIGINAL DATA | 1  0 | 1  1 | 0  1 | 1  0 | 0  1 | 0  0 |

(b). MFM | 0 1 0 0 | 0 1 0 1 | 0 0 0 1 | 0 1 0 0 | 1 0 0 1 | 0 0 1 0 |

(c). (2.7) RLLC | 1 0 0 0 | 0 1 0 0 | 0 0 0 1 | 0 0 0 0 | 0 0 1 0 | 0 0 0 0 |

(d). (1.7) RLLC | 0  0  0 | 1  0  1 | 0  1  0 | 1  0  0 | 0  1  0 | 0  1  0 |

FIG.2 PRIOR ART

| DATA | ENCODED WORD |
|---|---|
| 1 | 0  1 |
| 0 | X  0 |

(X IS A COMPLEMENT LOGIC OF AN ENCODED WORD IMMEDIATELY BEFORE)

FIG.3 PRIOR ART

| DATA | ENCODED WORD |
|---|---|
| 1  1 | 0  1  0  0 |
| 1  0 | 1  0  0  0 |
| 0  1  1 | 0  0  0  1  0  0 |
| 0  1  0 | 0  0  1  0  0  0 |
| 0  0  0 | 1  0  0  1  0  0 |
| 0  0  1  1 | 0  0  1  0  0  1  0  0 |
| 0  0  1  0 | 0  0  0  0  1  0  0  0 |

FIG.4 PRIOR ART
| DATA | ENCODED WORD |
|---|---|
| 1 0 | X 0 0 |
| 0 1 | 0 1 0 |
| 1 1 | X 0 1 |
| 0 0 1 0 | X 0 0 0 0 1 |
| 0 0 0 1 | X 0 0 0 0 0 |
| 0 0 1 1 | 0 1 0 0 0 1 |
| 0 0 0 0 | 0 1 0 0 0 0 |
(X IS A COMPLEMENT LOGIC OF AN ENCODED WORD IMMEDIATELY BEFORE)
FIG.10A
ENCODING
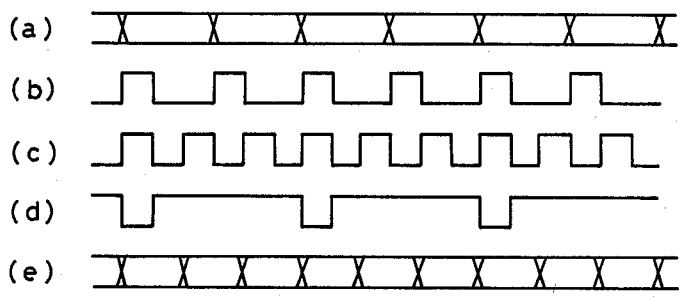
FIG.10B
DECODING
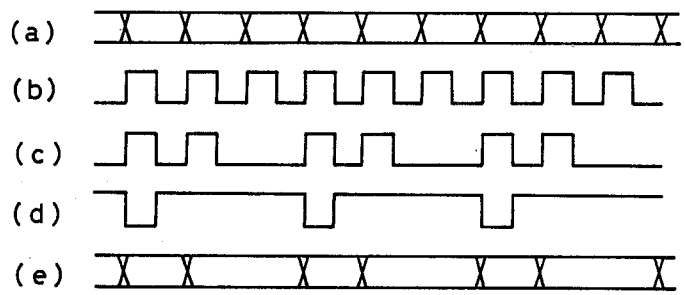

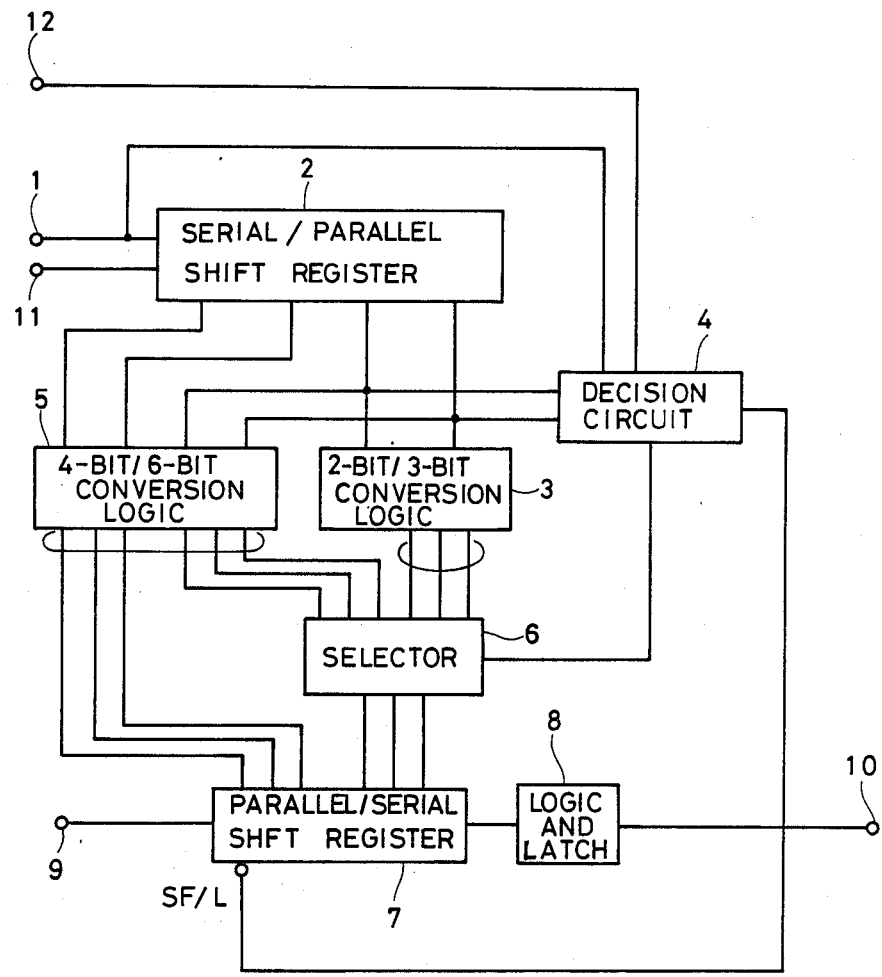

BINARY DATA ENCODING AND DECODING PROCESS

BACKGROUND OF THE INVENTION

1. Field of the Invention

The present invention relates to a process for encoding and decoding binary data which serves to convert a binary data sequence into a binary code sequence suitable for recording or to convert a recorded binary code sequence into an original binary data sequence in recording or reproducing binary data into, or from a recording medium such as magnetic tape, magnetic disk, optical disk, or the like.

2. Description of the Prior Art

So far, various encoding systems have been proposed and utilized in order to enhance the recording density in recording binary data in a recording medium such as magnetic tape, magnetic disk, optical disk, or the like.

FIG. 1 is a diagram showing conventional binary data encoding systems. In FIG. 1, (a) represents a bit pattern of the original binary data sequence before the encoding, and the numerals 0 and 1 represent the logic "0" and "1" of the bit. In FIG. 1, the encoding system indicated by (b) is designated Modified Frequency Modulation System (MFM System), and it is used in magnetic disk apparatuses (type 3330, 3340, 3350, etc) of IBM. The encoding system indicated by (c) is designated (2, 7) Runlength Limited Code (RLLC), and it is used in type 3370 magnetic disk apparatus of IBM. The encoding system indicated by (d) in FIG. 1 is designated (1, 7) RLLC.

The encoding systems indicated by (c) and (d) in FIG. 1 are disclosed in the following articles: namely, with regard to (c), U.S. Pat. No. 3,689,899 entitled "Run-Length-Limited Variable Length Coding with Error Propagation Limitation", P. Franaszek, 1972: with regard to (d), Japanese Patent Laying-Open Gazette No. 128024/1977, entitled "Binary Data Coding System", invented by Toshio Horiguchi and filed by Nippon Electric Co., Ltd. According to the above mentioned articles, a recording current is applied to the recording medium to record the code sequence converted by each encoding system as the Non Return to Zero Inverse signal (NRZI signal), in which the polarity is inverted generally at the bit "1".

Now, the conversion algorism of the MFM shown in FIG. 1(b) will be shown in FIG. 2. The conversion algorism of the (2, 7) RLLC of FIG. 1(c) will be shown in FIG. 3, and the conversion algorism of the (1, 7) RLLC of FIG. 1(d) will be shown in FIG. 4.

In recording binary data in a magnetic medium or in an optical disk medium, the following conditions are required of a common encoding system:

(1) It is capable of high density recording in the recording medium;
(2) The error propagation in the decoded data is limited in the case where an error is generated in the transmission system (process of record reproduction);
(3) The amount of hardware is small in view of cost-effectiveness;

and so forth. The following parameters are used as practical parameters for estimation:

m: numbers of bits of a data word
n: numbers of bits of an encoded word
d: minimum number of "0" in a sequence of "0"
k: maximum number of "0" in a sequence of "0"
T: time interval of one bit of a data word
Tw: detection window $$\left( Tw = \frac{m}{n} \times T \right) \quad (1)$$

Tmin: minimum interval between inversions ... (2)
Tmax: maximum interval between inversions ... (3)

Figure of Merit:

$$\frac{Tw}{T} \times \frac{Tmin}{T} = Tw \times Tmin \times \frac{1}{T^2} \quad (4)$$

In a common encoding system, the original data sequence is separated at every m bits to be converted into an encoded word of n bits. The converted code sequence is composed in such a manner that at least d "0"s but not more than k "0"s exist between a bit "1" and the succeeding bit "1".

In the case of high density recording of date in a recording medium, if the minimum interval between inversions (Tmin) become short, the conditions of recording transition (in magnetic recording, magnetic transition: in optical transition, recording pit) before and after the inversion are interfered with each other, causing errors in decoding a reproduction signal. If the detection window (Tw) is small, the number of errors in decoding increase due to various jitters in reproduction waveform, e.g. fluctuation or deterioration of the reproduction signal caused by an aberration in tracking the reproduction signal, fluctuation of the reproduction signal in media exchange, cross-talk between tracks, or external noise, or, particularly in an optical disk apparatus, distortion in the reproduced waveform derived from the astigmation fluctuation of the laser beams caused by an inclination of the disk, or asymmetry distortion of the pit caused by an aberration of the recording current. The production of the two parameters Tmin, Tw is designated as Figure of Merit, and the larger the value is, the smaller of the number of errors becomes, resulting in a high estimation. Meanwhile, in decoding the data, it is necessary to generate a clock for demodulation from the reproduced date, and, if the maximum interval between inversions (Tmax) is large, generation of the clock becomes difficult. Therefore, if the Tmax/Tmin ratio is small, the spectrum of the encoded code sequence centers upon the low frequency region, generally, and a distributed region of the spectrum becomes small, resulting in the enhancement of the reproduction S/N (Signal to Noise Ratio).

Table 1 shows the Figure of Merit of each of the encoding systems shown in FIG. 1.

TABLE 1

| item | system | | |
|---|---|---|---|
| | MFM | (2.7)RLLC | (1.7)RLLC |
| FIG. of Merit | 0.5 | 0.75 | 0.89 |

As shown in FIG. 1, the largest Figure of Merit is obtained in the (1, 7) RLLC system. Namely, the (1, 7) RLLC is one example of an encoding system, having the following values: number of bits in a data word, m=2; number of bits in an encoded word, n=3; minimum number of "0" in a sequence of "0", d=1; maximum number of "0" in a sequence of "0", K=7; detection window, Tw=0.67 T; minimum interval between inversions, Tmin=1.33 T. The following theses have reported that in an encoding system, if said d and k are determined, the theoretical limit of Tw is determined, and that if d and Tw (Tw is determined by m and n) are determined, the theoretical limit of the value of k is determined.

THESIS (1)

F. A. FRANASZEK, 1970. July IBM Journal. Res. Develop "Sequence-state Methods for Run-Length-Limited Coding"

THESIS (2)

D. T. TANG and L. R. BAHL 1970. Information and Control. 17. 436–461 "Block Codes for a Class of Constrained Noiseless Channels"

According to these theses, in case where the minimum number of "0" in a sequence of "0", d=1, the theoretical limit Tw/T for each of the maximum number of "0" in a sequence of "0", k is as follows:

TABLE 2

| K | 2 | 3 | 4 | 5 | 6 | 7 | 8 | 9 | 10 |
|---|---|---|---|---|---|---|---|---|---|
| Tw/T | 0.406 | 0.55 | 0.617 | 0.65 | 0.669 | 0.679 | 0.685 | 0.688 | 0.69 |

Now, in the case where the number of bits of a data word, m=2, and the number of bits of an encoded word, n=3, the detection window of the code Tw=0.66 T, and, therefore, the maximum number of "0" in a sequence of "0", i.e. the value of k is more than 6.

Accordingly, it was apparent that an encoded word having the values of m=2, n=3, d=1 and k=7, exists.

One implementation of such encoding system is disclosed in IEEE Transactions on Magnetics, Vol. MAG-12, No. 6 November 1976, pp. 740–742, "An Optimization of Modulation Codes in Digital Recording".

As for the method for this encoding system, the m/n conversion is performed at the first step, and, if the encoding cannot be achieved by this conversion, the m/n conversion is performed again with a larger value of m, on the assumption that the ratio of m/n is constant. Namely, the encoding system can be implemented by a variable length code, as shown in a patent with regard to the (2, 7) RLLC encoding system of FIG. 3, etc.

Therefore, in considering an encoding systems having the same value for each of the numbers m, n, d, k, the following conditions become practically important with regard to the above described conditions (2) and (3) required of a common encoding system.

(A) Average number of bits in an decoding error and the maximum number of decoding errors on the occasion of an error in the transmission system.

Generally, in an record reproducing apparatus such as magnetic disk or optical disk, the data is made up of sector units and, each sector is composed of a sector mark, data, error correction codes, etc. The error correction capability of the disk apparatus IBM type 3370 is such that a single burst error of 9 bits can be corrected with regard to the data of 512 byte in 1 block. With the enhancement of the correction capability, the amount of the total data increases and, therefore, the linear record density increases resulting in the decrease of the error ratio. Now, the (1, 7) RLLC code of FIG. 4 will be examined from this point. On the occasion of errors of 1 bit or 2 bits in the converted code sequence, the maximum number of errors (the number of bits between the first bit and the last bit in which a decoding error occurs) is designated Error max (at 1 bit), and the average number of decoding errors is designated Error Aver (at 1 bit). The Error max is determined by finding the peculiar portions out from the decoding algorism.

FIG. 5A shows an example of a pattern in which the maximum decoding error occurs by a 1-bit error, and FIG. 5B shows an example of a pattern in which the maximum decoding error occurs by a 2-bit error.

Meanwhile, the Error Aver is evaluated from the following operation: take out 4000 bits of M series quasi random signal of $2^{12}-1$ cycle, then convert it into 6000 bits of M series quasi random signal using the (1, 7) RLLC system, generate 1-bit or 2-bit errors at 6000 points in arbitrary portions of the converted code sequence, and count the number of decoding errors at every error point.

The resulting Error max and Error Aver are shown in Table 3.

TABLE 3

| Error max (at 1 bit) = 6 bits |
| Error max (at 2 bit) = 8 bits |
| Error Aver (at 1 bit) = 1.60 bits |
| Error Aver (at 2 bit) = 1.94 bits |

Accordingly, the maximum decoding errors and the average decoding errors derived from a 1-bit error or 2-bit error in the code sequence are both large in the (1,7) RLLC system, and this is the first drawback of the conventional encoding system.

(B) Synchronizing signals in a sector can be determined exclusively.

As described above, in a disk apparatus, the data is managed in each sector, and each sector comprises a sector synchronizing signal indicating the beginning of the sector, and a sub-synchronizing signal for dealing with a miss of the decoding clock in the sector. FIG. 6A is an example of the composition of data in each sector, and FIGS. 6B and 6C are examples of conversion patterns in encoding the sub-synchronizing signal by the (1, 7) RLLLC system. It is apparent from the algorism in FIG. 4 that the least change occurs in the conversion pattern in the case where the sub-synchronizing signal begins with "10". However, the conversion pattern of the synchronizing signal portion can not be determined exclusively even in this case. The reason is that in the (1, 7) RLLC system, two cases, namely, one case where the conversion is completed before the synchronizing signal as shown in FIG. 6B, and the other case where the conversion from 4-bit pattern to 6-bit pattern is carried out including the synchronizing signal as shown in FIG. 6C, can occur, and the conversion patters of the two differ from each other.

Synchronizing signals must be detected as a code pattern from the converted code sequence without decoding. The reason is that decoding clocks in every 3 bits are required in decoding, and these are determined by the synchronizing signals detected from the code sequence. Furthermore, when an error correction code is added to the data, there occurs a miss of the PLL (Phase Locked Loop) of the reproduction clock due to the drop out of the signal, etc. in the data, in a generally known composition of the two dimensional code. On this occasion, the position of the reproduced data on a data format of the two dimensional code composition must be reset by the sub-synchronizing signal. If it is not reset, all of the succeeding decoded data turn out to be errors. In this aspect also, the sub-synchronizing signal must be surely detected and, consequently, the conversion pattern of the synchronizing signal must accords with the encoding system in which the conversion is performed exclusively. This is the second drawback of the (1, 7) RLLC system.

(C) The amount of hardware required for encoding and decoding.

FIG. 7 is a schematic diagram of a circuit employed in the (1, 7) RLLC system. To start with, the structure of the circuit shown in FIG. 7 will be described. In FIG. 7, a serial/parallel shift register 2 comprises an input terminal 11 for receiving the original binary data, and an input terminal 1 for receiving a clock synchronized with the original data. The output from the serial/parallel shift register 2 is applied to a 2-bit/3-bit conversion logic 3 and a 4-bit/6-bit conversion logic 5. Meanwhile, a decision circuit 4 is composed of a counter and a logic and it receives clocks from the input terminal 1, and it receives decision data for determining whether the conversion is 2-bit/3-bit or 4-bit/6-bit from the input terminal 12. The output of the decision circuit 4 is applied to a selector 6 for switching the output of conversion logics 3 and 5. The converted data is applied to a parallel/serial shift register 7 controlled by a clock having 3/2 cycle applied to an input terminal 9, and the output of the register 7 is outputted from a terminal 10 via logic and a latch circuit 8.

Now, the operation of the circuit shown in FIG. 7 will be described. To start the conversion, the original binary data is inputted to the terminal 11, and the clock synchronized with the original data is inputted from the terminal 1. Then, the inputted original data is applied to the 2-bit/3-bit conversion logic 3 and the 4-bit/6-bit conversion logic 5 by means of the serial/parallel shift register 2 to be converted into a 3-bit code and a 6-bit code in the respective logics. Meanwhile, clocks generated in every two bits, original data clocks, and the decision data are inputted to the decision circuit 4 through the terminal 12 in order to determine whether the conversion is 2-bit/3-bit or 4-bit/6-bit. Since said decision circuit converts the original data into 6-bit if the given decision data is "00", a selector 6 is controlled such that it switches the outputs of the 2-bit/3-bit conversion logic 3 and the 4-bit/6-bit conversion logic 5. Consequently, the converted data of 6 bits is inputted to the parallel/serial shift register 7. The parallel/serial shift register 7 outputs the inputted 6-bit data as a serial data by means of the clock having 3/2 cycle inputted to the terminal 9. The decision circuit 4 controls the sift register 7 such that a shift load signal cannot enter the shift register 7 for the 6-bit period. Furthermore, in the 2-bit/3-bit conversion logic 3 and the 4-bit/6-bit conversion logic 5, conversion is carried out regarding the logic "X" in the conversion algorism in FIG. 4 as "1", so that if "11" is found in the converted code sequence, it needs to be converted into "10". Therefore, after the conversion is performed by the logic with such converting function and a latch circuit 8, the converted code sequence is outputted to the terminal 10. Decoding is carried out by performing said various operations in the reverse order, and the functional structure of the conversion is the same as in the case of encoding. As described above, conventional encoding and decoding require the generation of various control signals, and the structure thereof is rather complicated.

Since the binary data encoding and decoding system employing conventional (1, 7) RLLC is structured as above, although it has the largest Figure of Merit compared with other system, it still involves drawbacks such as:

(i) Bit length of a decoding error is large on the occuerance of errors;

(ii) Synchronizing signals in the data can not be determined exclusively in converting;

(iii) Hardware structure for encoding and decoding is complicated; etc.

SUMMARY OF THE INVENTION

Briefly stated, the present invention is a binary data encoding process comprising the steps of: applying a binary data sequence; separating the applied binary data sequence at every two bits; converting the binary data sequence separated at every two bits into a 3-bit code sequence according to a prescribed conversion algorism. If the binary data sequence separated at every two bits are represented as $\{D_{2n}, D_{2n+1}\}$ $(0<n<\infty)$ and the converted 3-bit code sequence are represented as $\{M_{3n}, M_{3n+1}, M_{3n+2}\}$ $(0<n<\infty)$, and a definition is given as $$Y_n = D_{2n+1} \times D_{2(n+1)}$$

$$Z_n = M_{3n} + M_{3n+1} + M_{3n+2}$$

the prescribed conversion algorism is represented by the following equations:

$$M_{3n} = D_{2n} \times (\overline{Y_{n-1}} + \overline{Z_{n-1}})$$

$$M_{3n+1} = \overline{M_{3n}} \times \overline{M_{3n+2}} \times (\overline{Y_{n-1}} + \overline{Z_{n-1}})$$

$$M_{3n+2} = D_{2n+1} \times (\overline{Y_{n-1}} + \overline{Z_{n-1}}) \times (\overline{Y_n} + Y_n \times D_{2(n+1)+1})$$

According to another aspect of this invention, a binary data decoding process for decoding a 3-bit code sequence encoded by said binary data encoding process comprises the steps of: separating the 3-bit code sequence at every three bit; decoding the 3 bit code sequence separated at every three bits into a binary data sequence according to a prescribed conversion algorism. The prescribed algorism is represented by the following equations:

$$D_{2n} = M_{3n} + \overline{Z_n}$$

$$D_{2n+1} = \overline{Z_{n+1}} + M_{3n+2} \times Z_{n+1} + \overline{Z_n} \times M_{3(n-1)+2}$$

According to yet another aspect of the present invention, a binary data decoding process further comprises the step of generating a flag signal for representing that the decoded binary data is erroneous.

Therefore, a primary object of this invention is to provide a binary data encoding and decoding process which mitigates the drawbacks of the conventional (1, 7) RLLC system while maintaining the same Figure of Merit as that of said conventional (1, 7) RLLC system.

Another object of this invention is to limit the propagation of error bits on the occasion of an error.

Yet another object of this invention is to convert the synchronizing signals included in a binary data sequence by a exclusive conversion pattern.

A further object of this invention is to simplify the hardware structure required for the encoding and decoding.

A primary advantage of this invention is that the reliability of the reproduced data of a magnetic disk apparatus or an optical disk apparatus is much improved, enabling the practical use of an apparatus having large capacity.

Another advantage of this invention is that it has high capacity of detecting errors on the occasion thereof.

These and other objects, features, and advantages of this invention will be apparent from the following description of the preferred embodiment taken with the accompanying drawings.

BRIEF DESCRIPTION OF THE DRAWINGS

FIG. 1 is a diagram describing various conventional binary data encoding systems.

FIG. 2 is a diagram showing a conversion algorism of the MFM system shown in FIG. 1(b).

FIG. 3 is a diagram showing a conversion algorism of the (2, 7) RLLC system shown in FIG. 1(c).

FIG. 4 is a diagram showing a conversion algorism of the (1, 7) RLLC system shown in FIG. 1(d).

FIG. 7 is a block diagram of a circuit used for the convensional (1, 7) RLLC encoding and decoding system.

FIGS. 10A and 10B are diagrams of waveforms showing the operation of the circuit shown in FIG. 9.

DESCRIPTION OF THE PREFERRED EMBODIMENTS

Figure 5A:
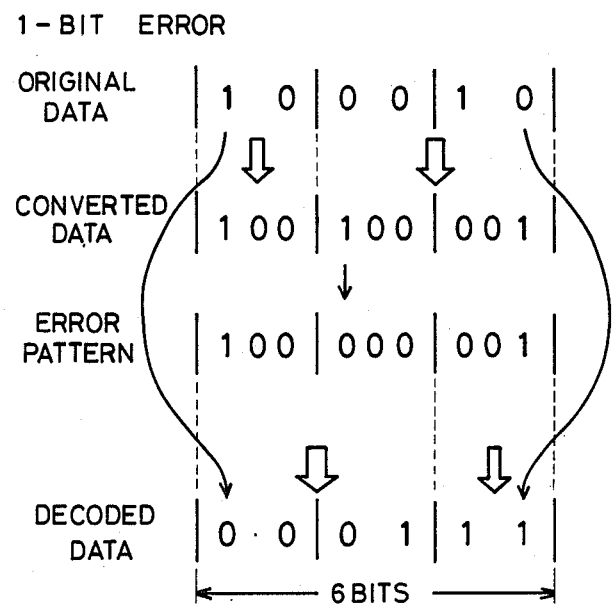
FIG. 5A is a diagram showing one example of a pattern in which a maximum decoding error occurs by a 1-bit error in the (1, 7) RLLC system.
Figure 5B:
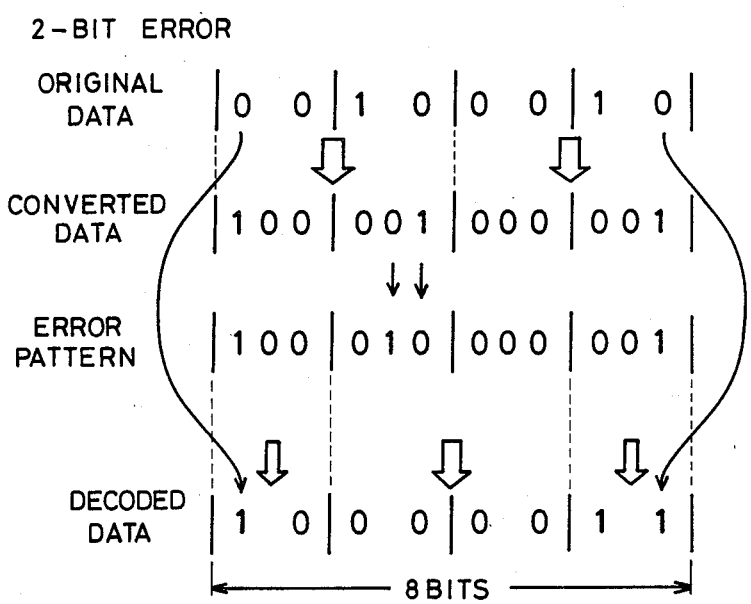
FIG. 5B is a diagram showing one example of a pattern in which a maximum decoding error occurs by a 2-bit error in the (1, 7) RLLC system.
Figure 6A:
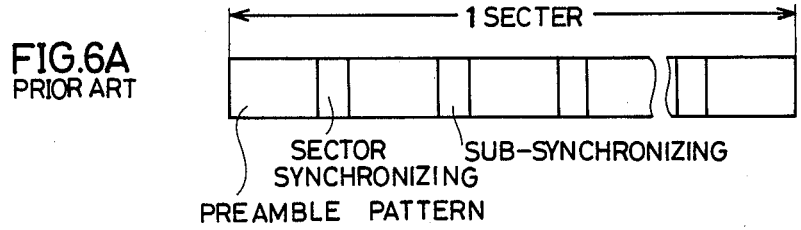
FIG. 6A is a diagram showing one example of data structure in one sector.
Figure 6B:
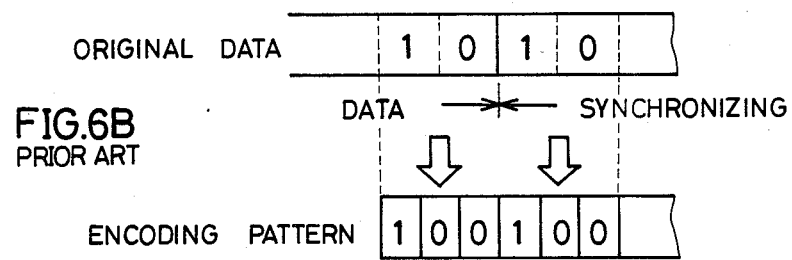
FIGS. 6B and 6C are diagrams showing examples of conversion patterns in converting the sub-synchronizing signals by the (1, 7) RLLC system.
Figure 6C:
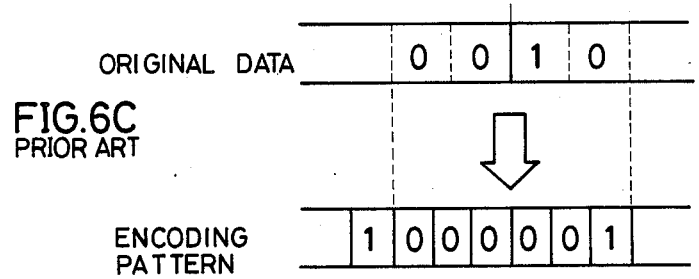

To start with, the basic conversion algorism for encoding according to this invention will be described.

Now, let us assume that a 2-bit data of the original binary data is represented by $\{D_{2n}, D_{2n+1}\}$, and the converted pattern is represented by $\{M_{3n}, M_{3n+1}, M_{3n+2}\}$.

In the case where at least one of the two bits directly adjacent to each other between adjacent two 2-bit data is "0", for example $\{D_{2n}, D_{2n+1}\}$ is $\{1, 0\}$ and $\{D_{2(n+1)}, D_{2(n+1)+1}\}$ is $\{0, 1\}$, the conversion pattern is defined as follows:

$$M_{3n} = D_{2n}$$
$$M_{3n+1} = \overline{M_{3n}} \times \overline{M_{3n+2}} \quad (5)$$
$$M_{3n+2} = D_{2n+1}$$

It is apparent from these equations that the condition, i.e. the minimum number of "0" in a sequence of "0", d=1, the maximum number of "0" in a sequence of "0", k=7, is satisfied. The conversion pattern of the above equations (5) is called a basic conversion.

In the case where both two bits directly adjacent to each other between adjacent two 2-bit data are "1", e.g. $\{D_{2n}, D_{2n+1}\}$ is $\{0, 1\}$ and $\{D_{2(n+1)}, D_{2(n+1)+1}\}$ is $\{1, 0\}$, the conversion pattern is defined as follows:

$$M_{3n} = D_{2n} \times D_{2(n+1)}$$
$$M_{3n+1} = \overline{M_{3n}} \times \overline{M_{3n+2}} \quad (6)$$
$$M_{3n+2} = D_{2n+1} \times D_{2(n+1)+1}$$

and, in addition, the succeeding $\{M_{3(n+1)}, M_{3(n+1)+1}, M_{3(n+1)+2}\}$ are all turned to "0". This conversion pattern is called a secondary conversion. According to the above basic conversion and the secondary conversion, the condition that the minimum number of "0" in a sequence of "0", d=1, and the maximum number of "0" in a sequence of "0", k=7 is satisfied in any code sequence.

Now, decoding corresponding to the above described encoding will be described.

Suppose a 3-bit code as $\{M_{3n}, M_{3n+1}, M_{3n+2}\}$, and the decoded 2-bit data as $\{D_{2n}, D_{2n+1}\}$.

In the case where the succeeding 3-bit code $\{M_{3(n+1)}, M_{3(n+1)+1}, M_{3(n+1)+2}\}$ is not $\{0, 0, 0\}$, a decoded data can be obtained by the following equations:

$$D_{2n} = M_{3n}$$
$$D_{2n+1} = M_{3n+2} \quad (7)$$

The decoding pattern of the above equations (7) is called a basic decoding.

In the case where the succeeding 3-bit code $\{M_{3(n+1)}, M_{3(n+1)+1}, M_{3(n+1)+2}\}$ is $\{0, 0, 0\}$, decoded data can be obtained by the following equations:

$$D_{2n} = M_{3n}$$
$$D_{2n+1} = 1$$
$$D_{2(n+1)} = 1 \quad (8)$$
$$D_{2(n+1)+1} = M_{3n+2}$$

The decoding pattern of the above equations (8) is called a secondary decoding.

Meanwhile, the fact that in this secondary decoding, the succeeding 2-bit data $\{D_{2(n+1)}, D_{2(n+1)+1}\}$ is also decoded means that a 6-bit code is decoded into a 4-bit data.

Next, decoding algorism will be described, which is capable of decoding a 3-bit code into a 2-bit data in any case without using the above described secondary decoding process.

Namely, in the case where the succeeding 3-bit code $\{M_{3(n+1)}, M_{3(n+1)+1}, M_{3(n+1)+2}\}$ has a pattern of $\{0, 0, 0\}$, the decoded data can be obtained by the following equations:

$$\left.\begin{array}{l} D_{2n} = M_{3n} \\ D_{2n+1} = 1 \end{array}\right\} \quad (9)$$

In the case where $\{M_{3n}, M_{3n+1}, M_{3n+2}\}$ itself is $\{0, 0, 0\}$, the decoded data is obtained by the following equations:

$$\left.\begin{array}{l} D_{2n} = 1 \\ D_{2n+1} = M_{3(n-1)+2} \end{array}\right\} \quad (10)$$

Now, let us consider decoding a 3-bit code sequence such as $\{M_{3n}, M_{3n+1}, M_{3n+2}\}$, $\{M_{3(n+1)}, M_{3(n+1)+1}, M_{3(n+1)+2}\}, \ldots$ by the conversion algorism structured as above. Provided that $\{M_{3n+1}, M_{3n+2}\}$ is converted by the basic conversion, even if a error occurs in decoding $M_{3n+1}$, a decoding error does not occur since the decoded data is:

$$D_{2n} = M_{3n}$$

$$D_{2n+1} = M_{3n+2}$$

Considering a case where $\{M_{3n}, M_{3n+1}, M_{3n+2}\}$, which is encoded by the basic conversion, is turned out to be $\{0, 0, 0\}$ due to a 1-bit error, it is expected that the error in the decoded data will expand to the directly preceding 2 bits. However, from the calculation of every expected pattern, the propagation length of the decoded data in this case is, 1-bit = 25%
2-bit = 50%
3-bit = 25% and, therefore, it is proved that the error is not propagated.

In addition, the conversion pattern of the synchronizing signals is determined exclusively without being effected by the conversion of the preceding data, by setting two bits at the beginning of the synchronizing signals "01" or "00".

A more generally represented encoding process for encoding a 2-bit data into a 3-bit code in any case will be hereinafter described.

Suppose a binary data sequence separated at every two bits is represented by $\{D_{2n}, D_{2n+1}\}$ $(0 < n < \infty)$, and the converted 3-bit code sequence is represented by $\{M_{3n}, M_{3n+1}, M_{3n+2}\}$ $(0 < n < \infty)$. By defining $$Y_n = D_{2n+1} \times D_{2(n+1)}$$

$$Z_n = M_{3n} + M_{3n+1} + M_{3n+2}$$

the three bits to be converted $\{M_{3n}, M_{3n+1}, M_{3n+2}\}$ are represented by the following equations:

$$\left.\begin{array}{l} M_{3n} = D_{2n} \times (\overline{Y_{n-1}} + \overline{Z_{n-1}}) \\ M_{3n+1} = \overline{M_{3n}} \times \overline{M_{3n+2}} \times (\overline{Y_{n-1}} + \overline{Z_{n-1}}) \\ M_{3n+2} = D_{2n+1} \times (\overline{Y_{n-1}} + \overline{Z_{n-1}}) \times (\overline{Y_n} + Y_n \times D_{2(n+1)+1}) \end{array}\right\} \quad (11)$$

where the marks X and + represent AND and OR of the logical operation, respectively.

Next, a more generally represented decoding process for decoding a 3-bit code into a 2-bit data in any case will be described.

Let us assume that code sequence separated at every three bits is represented by $\{M_{3n}, M_{3n+1}, M_{3n+2}\}$ $(0 < n < \infty)$, and the decoded 2-bit data sequence is represented by $\{D_{2n}, D_{2n+1}\}$ $(0 < n < \infty)$. According to the definition $$Z_n = M_{3n} + M_{3n+1} + M_{3n+2},$$

the two bits $\{D_{2n}, D_{2n+1}\}$ to be decoded are represented by the following equations:

$$\left.\begin{array}{l} D_{2n} = M_{3n} + \overline{Z_n} \\ D_{2n+1} = \overline{Z_{n+1}} + M_{3n+2} \times Z_{n+1} + \overline{Z_n} \times M_{3(n-1)+2} \end{array}\right\} \quad (12)$$

where the marks X and + represent AND and OR of the logic operation.

Figure 8A:
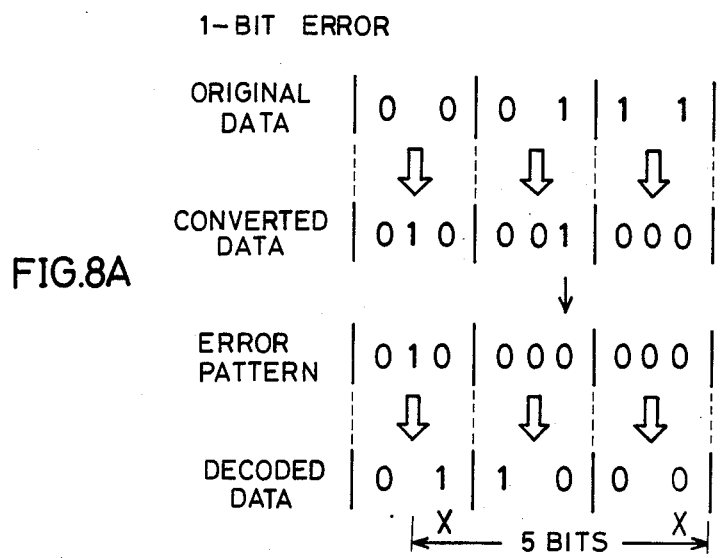
FIG. 8A is a diagram showing an example of a pattern in which a maximum decoding error occurs by a 1-bit error in the binary data encoding process according to this invention.
Figure 8B:
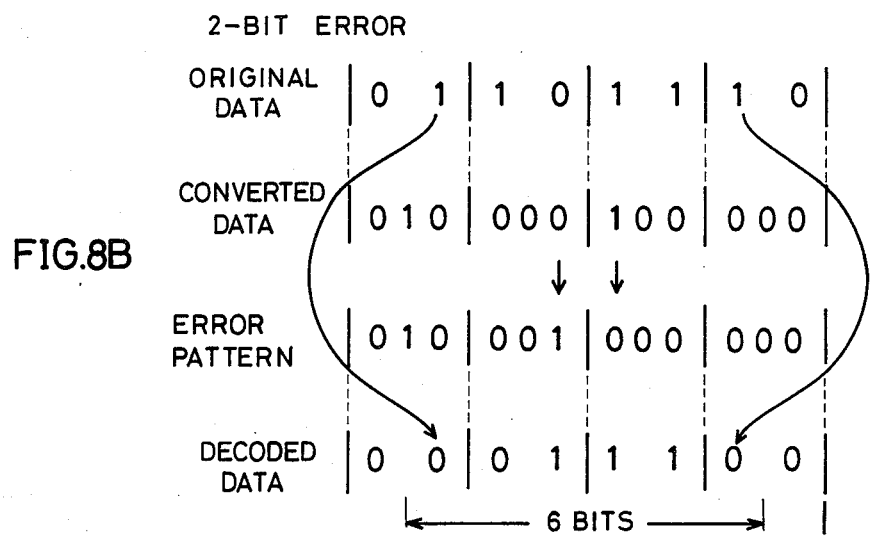
FIG. 8B is a diagram showing an example of a pattern in which a maximum decoding error occurs by a 2-bit error in the binary data encoding process according to this invention.

FIG. 8A shows an example of a pattern in which a maximum decoding error occurs by a 1-bit error in the code sequence in the above described binary data encoding and decoding process of this invention, and FIG. 8B shows an example of a pattern in which a maximum decoding error occurs by a 2-bit error.

The Error max and the Error Aver on the occasion of such 1-bit error or 2-bit error is evaluated in the same manner as in the conventional (1, 7) RLLC, and the result thereof is shown in Table 4.

TABLE 4

| |
|---|
| Error Max (at 1 bit) = 5 bits |
| Error Max (at 2 bit) = 6 bits |
| Error Aver (at 1 bit) = 1.18 bits |
| Error Aver (at 2 bit) = 1.61 bits |

Accordingly, compared with the conventional (1, 7) RLLC system shown in Table 3, both the maximum number of decoding errors and the average number of decoding errors are small, and, consequently, the propagation of errors are limited according to this invention.

Furthermore, according to this invention, an erasure signal indicating the occurence of an error is found out in the coding sequence in the case where the error propagation of more than 5 bits occurs. Namely, according to the algorism of this invention, essentially an arbitrary converted 3-bit code pattern and the succeeding 3-bit code will not be both $\{0, 0, 0\}$. However, as it will be seen from FIGS. 8A and 8B, in the case where an error pattern occurs in which the error is propagated for more than 5 bits in decoding, both of the succeeding two 3-bit patterns to be decoded are always $\{0, 0, 0\}$ pattern in the encoding sequence. Now, according to a common error correction code, the error correction is carried out on a basis of a symbol unit composed of a few bits. Therefore, if an error extends over several symbols, it cannot be corrected generally. However, according to this invention, an erasure signal indicating that the symbol is erroneous can be obtained even in such cases, resulting in much improvement of the error correction capability.

In addition, on the occasion of an error in the encoding sequence, the detection of a pattern which does not satisfy the condition of the minimum number of "0" in a sequence of "0", d=1, and the maximum number of "0" in a sequence of "0", k=7, e.g. a pattern of "11" or a pattern in which k>7 in the encoding sequence, can be done by said erasure signal.

Figure 9:
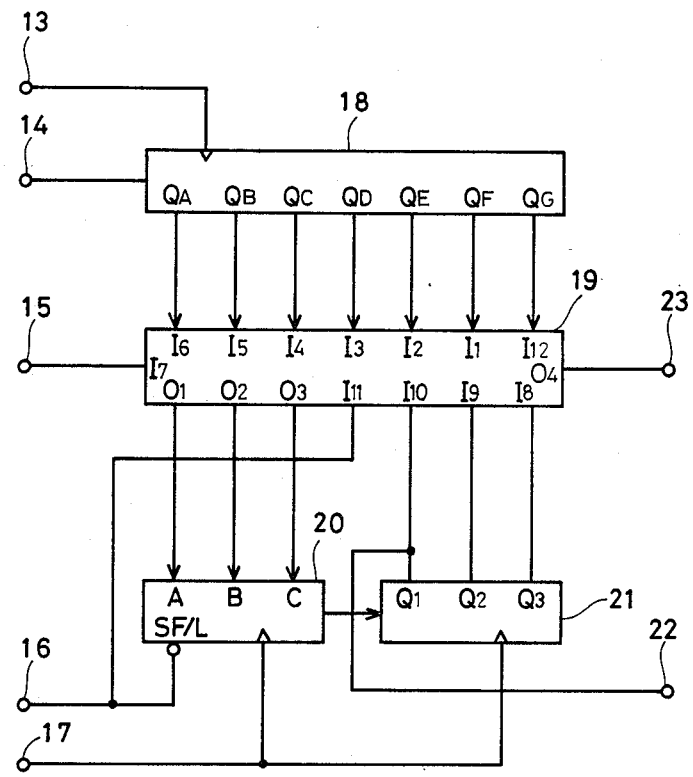
FIG. 9 is a block diagram of a circuit used for the binary data encoding and decoding process according to this invention.

FIG. 9 is a block diagram showing the hardware structure used for both of the binary data encoding and decoding process of this invention. The structure of the circuit shown in FIG. 9 will be described. In FIG. 9, a serial/parallel shift register 18 comprises an input terminal 14 for receiving the original binary data and an input terminal 13 for receiving a clock synchronized with said original data. The output of the serial/parallel shift register 18 is applied to a logic circuit 19. The logic circuit 19 is controlled by a control signal applied from a terminal 15 in such a manner that it selects either encoding or decoding, whereby it performs the selected operation. The output from the logic circuit 19 is applied to a parallel/serial shift register 20 which is controlled by a sub-clock applied to an input terminal 16 and a code clock applied to an input terminal 17. The output of this parallel/serial shift register 20 is applied to a serial/parallel shift register 21. The output of this serial/parallel shift register 21 is applied to the logic circuit 19 and at the same time outputted through a terminal 22.

FIGS. 10A and 10B are diagrams of waveforms for describing the operation of the circuit shown in FIG. 9.

The operation of encoding will be described with reference to FIGS. 9 and 10A.

In the operation of encoding, an encoding/decoding control signal inputted from a terminal 15 becomes "1" and the logic circuit 19 is controlled such that it performs encoding. Then, the original data(a) of FIG. 10A is inputted to a terminal 14, a clock(b) synchronized with the original data is inputted to a terminal 13, and the inputted original data(a) is converted into a parallel data by means of the serial/parallel shift register 18 to be inputted to the logic circuit 19. A 3-bit code generated by the conversion by the logic circuit 19 is outputted by means of $O_1$, $O_2$ and $O_3$ of the logic circuit 19 to be inputted to the parallel/serial shift register 20. The conversion algorism of the logic circuit 19 will be described later. A code clock(c) is inputted to the shift register 20 through a terminal 17, and a sub-clock(d) which is shift-loaded at every three cycles of the code clock(c) is inputted to the shift register 20 through a terminal 16. When the signal(d) is "0", the parallel/serial shift register 20 latches the input data, then outputs the converted code as a serial data, and applies it to the serial/parallel shift register 21. The shift register 21 applies the delayed 3-bit converted code to the logic circuit 19 as an input, and at the same time outputs the converted code sequence(e) from a terminal 22.

The operation of decoding will be described with reference to FIGS. 9 and 10B.

In decoding, the encoding/decoding control signal at the terminal 15 becomes "0" and the logic circuit 19 is controlled such that it performs decoding. As is the same as in the conversion, the encoded data sequence(a) is inputted to the terminal 14 and the code clock(b) is inputted to the terminal 13. A decoding clock(c) obtained by deviding the code clock(b) by ⅔ is inputted to the terminal 17. The parallel data outputted from the serial/parallel shift register 18 is converted to be decoded by the logic circuit 19, then applied to the shift register 20. A sub-clock(d) which is shift-loaded at every 2 cycles of the decoding clock(c) is inputted to the parallel/serial shift register 20 through the terminal 16, and, when the signal(d) is "0", the shift register 20 latches the data, then provides the decoded data at the output terminal 22 as an output through the shift register 21 as is this same as in the converting operation.

Meanwhile, a terminal 23 is an output terminal of the flag signal which indicates the occurence of an error, to which an error flag is outputted in the case where "11" occurs in the encoded data sequence to be inputted to $I_1 \sim I_6$ of the logic circuit in decoding, or $I_1 \sim I_6$ are all "0" when the subclock(d) is "0". The logic of the logic circuit is performed according to the conversion algorism of the above described equation (11) in encoding, and according to the conversion algorism of the above mentioned equations (12) in decoding. More specifically described, outputs $O_1 \sim O_4$ for the inputs $I_1 \sim I_{12}$ of the logic equation of the logic circuit 19 are as follows:

$$O_1 = I_7 \times I_3 \times (\overline{Y_1} + \overline{Z_1}) \times (\overline{Y_2} + Y_2 \times I_5)$$

$$O_2 = I_7 \times \overline{O_1} \times \overline{O_3} \times (\overline{Y_1} + \overline{Z_1}) + \overline{I_7} \times (\overline{P_2} + I_3 \times P_2 + I_{12} \times \overline{P_1})$$

$$O_3 = I_7 \times I_2 \times (\overline{Y_1} + \overline{Z_1}) + \overline{I_7} \times (I_1 + \overline{P_1})$$

$$O_4 = I_{11} \times \{\overline{I_1} \times \overline{I_2} \times \overline{I_3} \times \overline{I_4} \times \overline{I_5} \times \overline{I_6} + I_1 \times I_2 + I_2 \times I_3 + I_3 \times I_4 + I_4 \times I_5 + I_5 \times I_6\}$$

where $$Y_1 = I_1 \times I_2$$

$$Y_2 = I_3 \times I_4$$

$$Z_1 = I_8 + I_9 + I_{10}$$

$$Z_2 = O_1 + O_2 + O_3$$

$$P_1 = I_1 + I_2 + I_3$$

$$P_2 = I_4 + I_5 + I_6$$

Although the present invention has been described with reference to specific embodiments, it should be understood that these embodiments are examplary preferred embodiments and that modifications may be made without departing from the scope of the invention as defined in the appended claims.

What is claimed is:

1. A binary data encoding process comprising the steps of:

applying a binary data sequence;

separating said binary data sequence at every two bits; and converting said binary sequence separated at every two bits into a 3-bit code sequence according to a prescribed algorithm; wherein by representing said binary data sequence separated at every two bits by $\{D_{2n}, D_{2n+1}\}$ ($0 < n < \infty$) and the converted 3-bit code sequence by $\{M_{3n}, M_{3n+1}, M_{3n+2}\}$ ($0 < n < \infty$), and by defining $$Y_n = D_{2n+1} \times D_{2(n+1)}$$

$$Z_n = M_{3n} + M_{3n+1} + M_{3n+2}$$

said prescribed conversion algorithm is represented by the following equations:

$$M_{3n} = D_{2n} \times (\overline{Y_{n-1}} + \overline{Z_{n-1}})$$

$$M_{3n+1} = \overline{M_{3n}} \times \overline{M_{3n+2}} \times (\overline{Y_{n-1}} + \overline{Z_{n-1}})$$

$$M_{3n+2} = D_{2n+1} \times (\overline{Y_{n-1}} + \overline{Z_{n-1}}) \times (\overline{Y_n} + Y_n \times D_{2(n+1)+1}).$$

2. A binary data encoding process according to claim 1, wherein said step of separating the binary data sequence at every two bits is performed by a serial/parallel shift register, and said step of converting said binary data sequence separated at every two bits into a 3-bit code sequence is performed by a logic circuit performing said prescribed conversion algorism and by a parallel/serial shift register.

3. A binary data decoding process comprising the steps of:

applying a 3-bit code sequence; wherein said 3-bit code sequence is obtained by the separation of a binary data sequence at every two bits and the conversion thereof into a 3-bit code sequence according to a first conversion algorithm, said first algorithm being represented, by representing said binary data sequence separated at every two bits by $\{D_{2n}, D_{2n+1}\}$ $(0 < n < \infty)$ and the converted 3-bit code sequence by $\{M_{3n}, M_{3n+1}, M_{3n+2}\}$ $(0 < n < \infty)$, and by defining $$Y_n = D_{2n+1} \times D_{2(n+1)}$$

$$Z_n = M_{3n} + M_{3n+1} + M_{3n+2}$$

by the following equations, $$M_{3n} = D_{2n} \times (\overline{Y_{n-1}} + \overline{Z_{n-1}})$$

$$M_{3n+1} = \overline{M_{3n}} \times \overline{M_{3n+2}} \times (\overline{Y_{n-1}} + \overline{Z_{n-1}})$$

$$M_{3n+2} = D_{2n+1} \times (\overline{Y_{n-1}} + \overline{Z_{n-1}}) \times (\overline{Y_n} + Y_n \times D_{2(n+1)+1}):$$

separating said 3-bit code sequence at every three bits; and decoding said 3-bit code sequence separated at every three bits into said binary data sequence according to a second conversion algorithm, wherein said second conversion algorithm is represented by the following equation:

$$D_{2n} = M_{3n} + \overline{Z_n}$$

$$D_{2n+1} = \overline{Z_{n+1}} + M_{3n+2} \times Z_{n+1} + \overline{Z_n} \times M_{3(n-1)+2}.$$

4. A binary data decoding system according to claim 3, further comprising a step of generating a flag signal indicating that the decoded binary data is erroneous in the case where a 3-bit code $\{M_{3n}, M_{3n+1}, M_{3n+2}\}$ to be decoded according to said second conversion algorithm and succeeding 3-bit code $\{M_{3(n+1)}, M_{3(n+1)+1}, M_{3(n+1)+2}\}$ are both $\{0, 0, 0\}$, and the number of "0" in a sequence of "0" between an arbitrary "1" and the succeeding "1" is not in the prescribed scope.

* * * * *